United States Patent [19]

Coad et al.

[11] Patent Number: 4,885,069
[45] Date of Patent: Dec. 5, 1989

[54] COATING IMPROVEMENTS

[75] Inventors: Joseph P. Coad, Uffington; David S. Rickerby, Wantage; Philip Warrington, Harwell, all of England

[73] Assignee: United Kingdom Atomic Energy Authority, London, England

[21] Appl. No.: 149,438

[22] Filed: Dec. 18, 1987

Related U.S. Application Data

[63] Continuation of Ser. No. 879,637, Jun. 27, 1986, abandoned.

[30] Foreign Application Priority Data

Jul. 1, 1985 [GB] United Kingdom ............... 8516580
Nov. 1, 1985 [GB] United Kingdom ............... 8526948

[51] Int. Cl.⁴ .................................................. C23C 14/34
[52] U.S. Cl. ................................... 204/192.31; 204/298
[58] Field of Search ..................... 204/192.12, 192.15, 204/192.3, 192.31, 298 PI

[56] References Cited

U.S. PATENT DOCUMENTS 4,525,262 6/1985 Class et al. ..................... 204/192 R

FOREIGN PATENT DOCUMENTS 2090291 7/1982 United Kingdom ........... 204/192.31

OTHER PUBLICATIONS

R. A. Dugdale et al., "Sputter ion Plating", Advanced in Surface Coating Techn-Int. Conference, London, 13-15, Feb. 1978.
Spalvins, "Survey of Ion Plating Sources", J. Vac. Sci. Techol., vol. 17, No. 1, Jan/Feb. 1980, pp. 315-321.
D. M. Mattox, "Fund. of Ion Plating", J. Vac. Sci. Technol., vol. 10, No. 1, Jan./Feb. 1973, pp. 57-52.

Primary Examiner—Nam X. Nguyen
Attorney, Agent, or Firm—William R. Hinds

[57] ABSTRACT

A coating is formed on a substrate by sputter ion plating wherein a DC glow discharge is generated under soft vacuum conditions in the presence of the substrate and of a cathode constituted by the coating material thereby to release material at the cathode by ion bombardment, which released material diffuses to the substrate to form the coating thereon, and wherein a potential is applied to the substrate during coating.

In order to control the coating, for example when it is an alloy containing Al and when the substrate has sharp edges, the potential is applied in the form of an AC bias of e.g. 20 to 200 volts wherein ion polishing occurs in the negative part of the cycle and retention of coating material in the positive part thereof.

7 Claims, 1 Drawing Sheet

COATING IMPROVEMENTS

This is a continuation of U.S. patent application Ser. No. 879,637 filed June 27, 1986, abandoned.

This invention relates to the coating of substrates by sputter ion plating.

Sputter ion plating is a known coating technique and involves the transfer of material from a cathode to a substrate in the presence of a DC glow discharge in a soft vacuum chamber wherein the material is generated from the cathode by the action of ion bombardment, i.e. sputtering, and ultimately diffuses to the substrate to form a coating thereon. Sputter ion plating is described in detail in a number of references in the art, for example in Proc. conf. on 'Ion plating and Allied Techniques', Edinburgh, 1977, CEP Consultants, Edinburgh, 177 by R. A. Dugdale; Metals Technology 1982, 9, 499 by J. P. Coad and J. E. Restall; and NATO Advanced Workshop on 'Coatings for Heat Engines', Acquafredda di Maratea, Italy, April 1984 by J. P. Coad and D. S. Rickerby.

In the practice of sputter ion plating, a negative bias voltage may advantageously be applied to the coated substrate to cause densification of the coating by resputtering of deposited material and ion polishing. A negative bias voltage applied in this way may, however, give rise to problems. For example, where the coating material includes Al, which is difficult to control using sputter ion plating, and where the substrate has parts such as edges where the bias field is concentrated, the concentration of Al in the coating produced on those parts is markedly reduced.

The invention is concerned with ameliorating the above-mentioned problem and provides a method of forming a coating on a substrate by sputter ion plating comprising generating a DC glow discharge under soft vacuum conditions in the presence of the substrate and of a cathode constituted by the coating material thereby to release material at the cathode by ion bombardment, which released material diffuses to the substrate to form the coating thereon, and, during said coating, applying an AC bias potential to the substrate thereby to control the properties of the coating.

The waveform of the bias potential may be of any shape that enables negative voltages to be applied to the substrate for part of the time during which coating is taking place. For example, it may be sinusoidal, rectangular, or any convenient shape. It need not necessarily be of fixed frequency nor of balanced positive and negative amplitude. Use of an AC bias has the advantage that the maximum voltage (which causes the Al to sputter away most readily) is applied for only a fraction of the time. For example, a 240 volts AC supply may be suitable; by choosing the appropriate input phase, the phase of the AC bias may be varied to match the power supply providing the main sputtering power.

If required, the method may be carried out in the presence of a reactive gas (e.g. $O_2$ or $N_2$) that reacts with the released material to form a coating that is chemically different from the released material. This is known in the art as 'reactive sputtering'.

The invention is suited to the production of coatings containing elements which have a low threshold energy for sputtering. Examples of such elements are aluminium, which has been mentioned above, and yttrium. Particular examples of materials containing such elements are high temperature coating alloys, for example, those falling within the general formula MCrAlY such as CoCrAlY and NiCoCrAlY; NiCrAlTi; and NiCrAlSi.

Examples of substrate materials including metals such as steels (e.g. mild, carbon or stainless), Al and Al base alloys, Ta, Cu, Mo and Ni and Ni base alloys; and ceramics such as silica and alumina. Also, as indicated above, the invention is particularly useful for coating substrates having relatively sharp edges since loss of coating material at such edges may be avoided. Examples of such substrates are aerofoil components in gas turbine engines. Of particular value for such applications is the finding that NiCrAlSi coatings produced by the method of the invention possess outstanding resistance to corrosion.

BRIEF DESCRIPTION OF DRAWINGS

The invention will now be particularly described by way of example only where reference will be made to the accompanying drawings, the sole FIGURE of which is a schematic diagram of an apparatus for carrying out coating by sputter ion plating.

Figure 1:
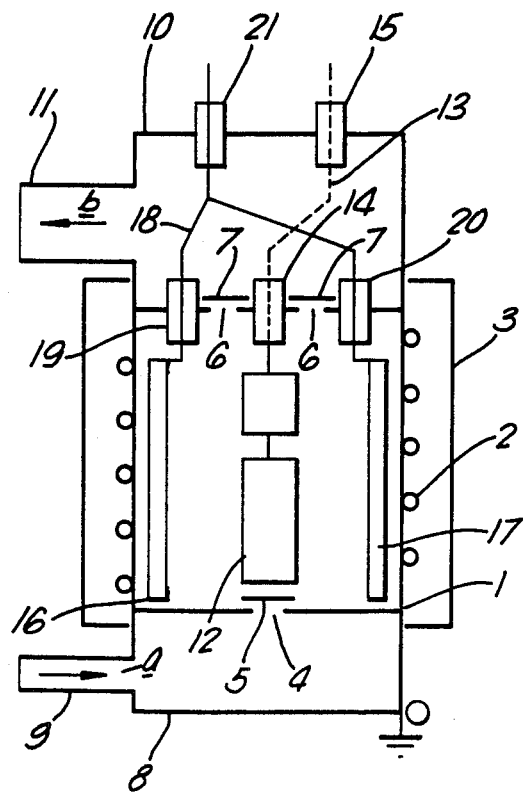
Referring to FIG. 1, an earthed cylindrical coating chamber 1 is provided with an externally mounted resistance heater 2 having a cooling jacket 3. The coating chamber 1 has a gas inlet vent 4 with an associated baffle 5 and gas outlet vents 6 with associated baffles 7. The inlet vent 4 communicates with a getter chamber 8 provided with an inlet conduit 9 and the outlet vents 6 communicate with a pumping chamber 10 provided with a pumping port 11.

A substrate 12 is mounted in the coating chamber 1 and is electrically coated to a bias potential power supply (not shown) by a conductor 13 mounted in insulators 14 and 15 positioned in the walls of the pumping chamber 10. A cathode in the form of a series of target plates of which two 16 and 17 are shown is also mounted within the coating chamber 1. The cathode (e.g. 16 and 17) is electrically connected to a cathode power supply (not shown) by a conductor 18 mounted in insulators 19, 20 and 21 positioned in the walls of the pumping chamber 10.

In operation of the apparatus shown in FIG. 1, an operating gas is supplied at the inlet conduit 9 and, by operation of a pump (not shown) at the pumping port 11, is drawn into the getter chamber 8 as shown by arrow a and thence into the coating chamber 1 via inlet vent 4. The coating chamber 1 is heated by means of the heater 2 in order to outgas the substrate 12, cathode (e.g. 16 & 17) and evaporate any organic material. Undesired gas and vapour leave the coating chamber 1 via the outlet vents 6 to enter the pumping chamber 10 and are removed via the pumping port 11 as shown by arrow b. A high negative voltage is applied to the target plates (e.g. 16 and 17) by means of the cathode power supply (not shown) to produce a glow discharge with net transfer of cathode material therefrom by sputtering onto the substrate 12 to provide a coating thereon. External heating is not required at this stage since the process generates sufficient power to maintain the operating temperature. An AC bias is applied to the coated substrate 12 thereby produced using the biasing means in order to densify the coating by resputtering of deposited material and ion polishing.

EXAMPLES

General Procedure

The apparatus shown in the FIGURE was used. The coating chamber 1 was pumped down to 10–100 m torr pressure with a flowing high purity argon atmosphere purified by passing over freshly deposited titanium. The coating chamber 1 was heated to a temperature of around 300° C. to effect outgassing of the substrate 12 and the cathode e.g. 16 and 17 and evaporation of any organic material. A high negative voltage (typically 400 V to 1500 V) was then applied to the cathode e.g. 16 and 17 to produce a glow discharge with net transfer of material therefrom to the substrate 12 to effect coating thereof. An AC bias from 240 V AC supply (10 to 100 volts RMS) was applied to the coated substrate 8 to densify the coating. Where reactive sputtering was required, a reactive gas was admitted to the coating chamber 1 at a small partial pressure (1 to 100 m torr) during the coating process.

SPECIFIC EXAMPLES

The above procedure was used to coat a substrate having sharp edges with a CoCrAlY alloy to confer high temperature oxidation and hot corrosion resistance properties, the cathode comprising the CoCrAlY alloy. The procedure was also used to coat substrate samples in the form of IN600 test coupons with an yttrium containing coating and substrate samples in the form of turbine blades having sharply radiused edges with an aluminium containing coating. The AC bias applied to the samples was 50 V AC. In the former case, the yttrium concentration of the coated samples was measured on a flat surface and in the latter case, the aluminium concentration of the coated samples was measured at an edge thereof.

By way of comparison, the examples were repeated using a positive bias voltage (+50 V DC) and a negative bias voltage (−50 V DC). The results are summarised in the table below.

| Sample Bias Voltage | Y Concentration (weight %) | Al Concentration (weight %) |
|---|---|---|
| + 50V DC | 0.51 | 9.4 |
| − 50V DC | 0.06 | 0.7 |
| 50V AC | 0.28 | 9.4 |

It can be seen from the table that use of an AC bias prevents aluminium removal from sharp edges and reduces the loss of yttrium from a coating produced by sputter ion plating. Maintenance of aluminium and yttrium levels is important in order to provide satisfactory resistance to hot corrosion and oxidation.

In another example, using the above-mentioned general procedure, a substrate sample was coated with tungsten and the example repeated under otherwise identical conditions with a conventional negative sample bias. It was found that use of the AC bias reduced the level of internal stress remnant in the coating compared with use of the negative bias.

In a further example, using the above-mentioned procedure, turbine blades were coated with an alloy based on nickel, chromium, aluminium and silicon (a NiCrAlSi alloy) and the coated blades tested for several hundred hours under arduous corrosive conditions in a marine gas turbine engine. At the conclusion of the test, the coating was found to have performed considerably better than commercially available Pt-Al and some proprietory electron beam evaporated CoCrAlY coatings.

We claim:

1. A method of forming a coating on a metal substrate by sputter ion plating comprising generating a glow discharge under vacuum conditions in the presence of the substrate and of a cathode constituted by the coating material thereby to release atoms of material at the cathode by ion bombardment, some at least of which atoms are ionised and are attracted to the substrate to form the coating thereon, by sputter ion plating and, during formation of said coating, applying an AC bias potential to the substrate such that the substrate has a negative potential for part only of the time during which coating is taking place such that ion polishing occurs in the negative part of the AC cycle and retention of coating material in the positive part thereof.

2. A method as claimed in claim 1 wherein the bias potential is of sinusoidal wave form.

3. A method as claimed in claim 1 wherein the bias potential is in the range of 20 to 200 volts.

4. A method as claimed in claim 1 wherein the coating material is an aluminium and/or yttrium containing material.

5. A method as claimed in claim 4 wherein the coating material is an aluminium alloy.

6. A method as claimed in claim 1 wherein the substrate is a steel substrate.

7. A method as claimed in claim 6 wherein the substrate is an aerofoil component for a gas turbine engine.

* * * * *